(12) United States Patent
Cavigelli

(10) Patent No.: US 6,633,169 B1
(45) Date of Patent: Oct. 14, 2003

(54) MONITORING LEAKAGE CURRENTS FROM HIGH-VOLTAGE DEVICES

(75) Inventor: George A. Cavigelli, Lexington, MA (US)

(73) Assignee: Doble Engineering Company, Watertown, MA (US)

( * ) Notice: Subject to any disclaimer, the term of this patent is extended or adjusted under 35 U.S.C. 154(b) by 339 days.

(21) Appl. No.: 09/289,076

(22) Filed: Apr. 8, 1999

(51) Int. Cl.[7] .......................... G01R 31/14; G01R 31/28
(52) U.S. Cl. ...................... 324/551; 324/127; 324/529; 324/510
(58) Field of Search ................. 324/551, 522, 324/529, 541, 544, 127, 509, 510

(56) References Cited

U.S. PATENT DOCUMENTS

| 3,881,149 A | * | 4/1975 | Kiko ........................... 324/127 |
| 4,896,115 A | | 1/1990 | LaMaitre et al. ........... 324/551 |
| 4,929,903 A | * | 5/1990 | Saigo et al. ................. 324/544 |
| 5,471,144 A | | 11/1995 | Meyer ......................... 324/551 |
| 5,652,521 A | * | 7/1997 | Meyer ......................... 324/551 |

FOREIGN PATENT DOCUMENTS

CA 2133047 3/1995 ........... G01R/31/02

OTHER PUBLICATIONS

University Physics, Third Edition, Francis W. Sears et al. 1964, p. 617.*
Electronic Commication, Fifh Edition, Robert L Shrader, 1985, p. 80.*
Design Ideas, "Active Loa Improves Probe's Response," Netzer, EDN, Nov. 5, 1980, pp. 342–343.
Design Ideas, "Active Loads Improve Current–Probe Performance," Gross, EDN, Jan. 5, 1978, pp. 94, 96.

* cited by examiner

Primary Examiner—Anjan K. Deb
(74) Attorney, Agent, or Firm—Fish & Richardson P.C.

(57) ABSTRACT

Monitoring a leakage current from an isolator for a high voltage conductor to ground includes directing the leakage current through a primary wire inductively coupled to a secondary winding energizing an amplifier.

17 Claims, 8 Drawing Sheets

MONITORING LEAKAGE CURRENTS FROM HIGH-VOLTAGE DEVICES

The invention relates generally to current monitoring and, more particularly, to monitoring currents leaking between high voltage sources and ground.

In power switching stations, the quality of insulators and high voltage isolation devices is of central importance. Monitoring leakage currents during operation could provide information on the quality of high voltage insulators and changes in the quality due to age.

Monitoring weak leakage currents inside an operating high voltage power station is difficult for several reasons. A power station is a source of both electromagnetic (EM) noise and high fluctuating currents. For example, power stations employ radio transmitters to relay control and/or data signals. These transmitters produce radio frequency backgrounds that can mask signals from weak currents. Power switching operations also produce EM backgrounds, which mask weak signals and can damage sensitive amplifiers. Nearby lightning strikes can produce high leakage currents from insulators in the station, e.g., up to about 60,000 amps. Such currents can damage sensitive monitoring equipment. Varying temperatures can introduce systematic errors into current monitoring measurements performed at an outdoor power station. EM noise, high currents and temperature variations can interfere with the monitoring of leakage currents in a power station.

It is an important object of the invention to provide improved current monitoring.

In a first aspect, the invention provides a device for monitoring leakage currents between insulators for high voltage conductors and ground. The device includes a transformer and an amplifier. The transformer comprises a primary wire and a secondary winding. The primary wire carries a leakage current from the insulator to the ground. The amplifier has two input terminals connected across the secondary winding and produces an output signal proportional to the leakage current.

In a second aspect, the invention provides a device for monitoring leakage currents between a high voltage insulator and ground. The device includes a transformer and an amplifier. The transformer has a primary wire and a secondary winding having a resistance. The primary winding is adapted to carry a leakage current from the high voltage insulator to ground. The amplifier has input terminals connected across the secondary winding. The amplifier produces a voltage rise across the secondary winding substantially cancelling a voltage drop caused by the resistance. The amplifier produces an output signal responsive to a current in the secondary winding.

In a third aspect, the invention provides a method of monitoring leakage currents from insulators for high voltage conductors. The method includes producing a leakage current in a grounding wire attached to the insulator and producing a current in a winding inductively from the leakage current in the grounding wire. The method also includes applying a voltage across the winding to cancel a voltage drop in the winding due to the winding resistance and measuring the inductively produced current.

In a fourth aspect, the invention provides a device for monitoring leakage currents from a high voltage insulator. The device includes a grounding wire electrically connecting the high voltage insulator to ground and a metal housing having a hole. The grounding wire passes through the hole. The device also includes an amplifier, a magnetically permeable core, and a secondary winding, all located in the housing. The core inductively couples the secondary winding to the grounding wire, which passes through the core. The secondary winding attaches across first and second input terminals of the amplifier.

Other objects, features, and advantages of the invention will be apparent from the following description taken together with the drawings in which.

Figure 5:
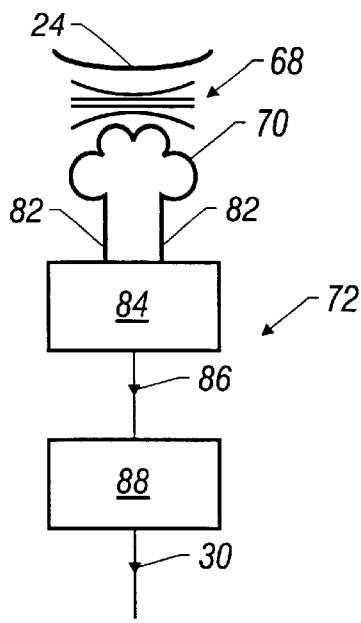
FIG. 5 is a high-level block diagram of the amplifier for the current produced by secondary winding of the measuring transformer shown in FIGS. 3 and 4.
Figure 6B:
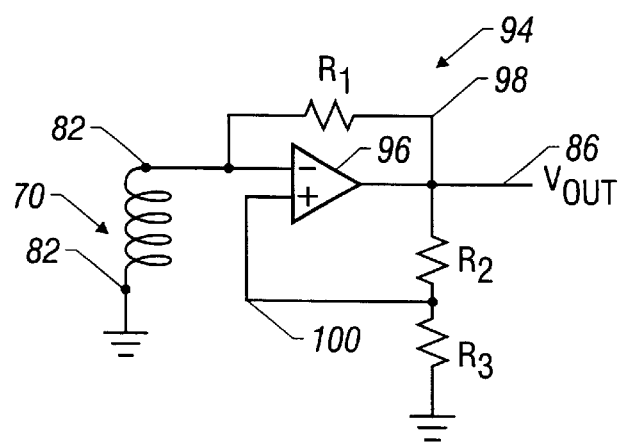
FIG. 6A is an equivalent circuit illustrating the measuring transformer of FIGS. 3–5.
Figure 6A:
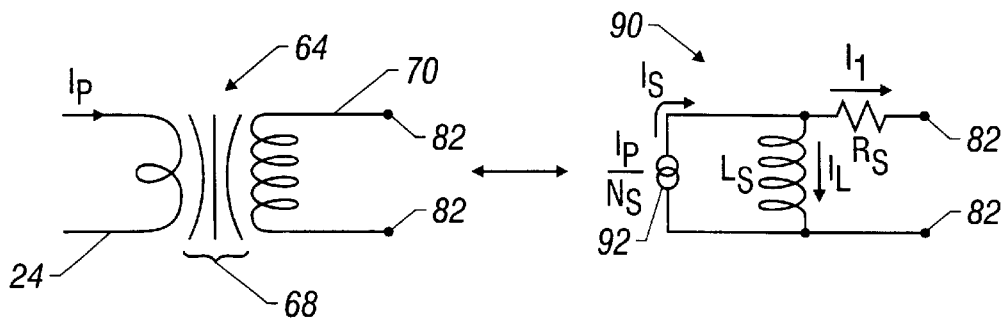
Figure 6C:
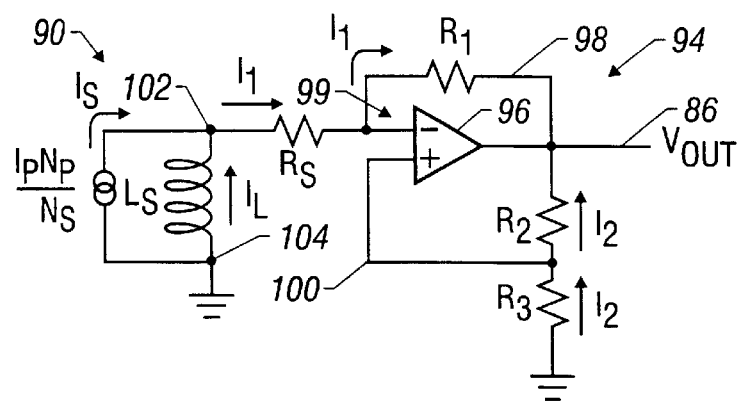
Figure 7A:
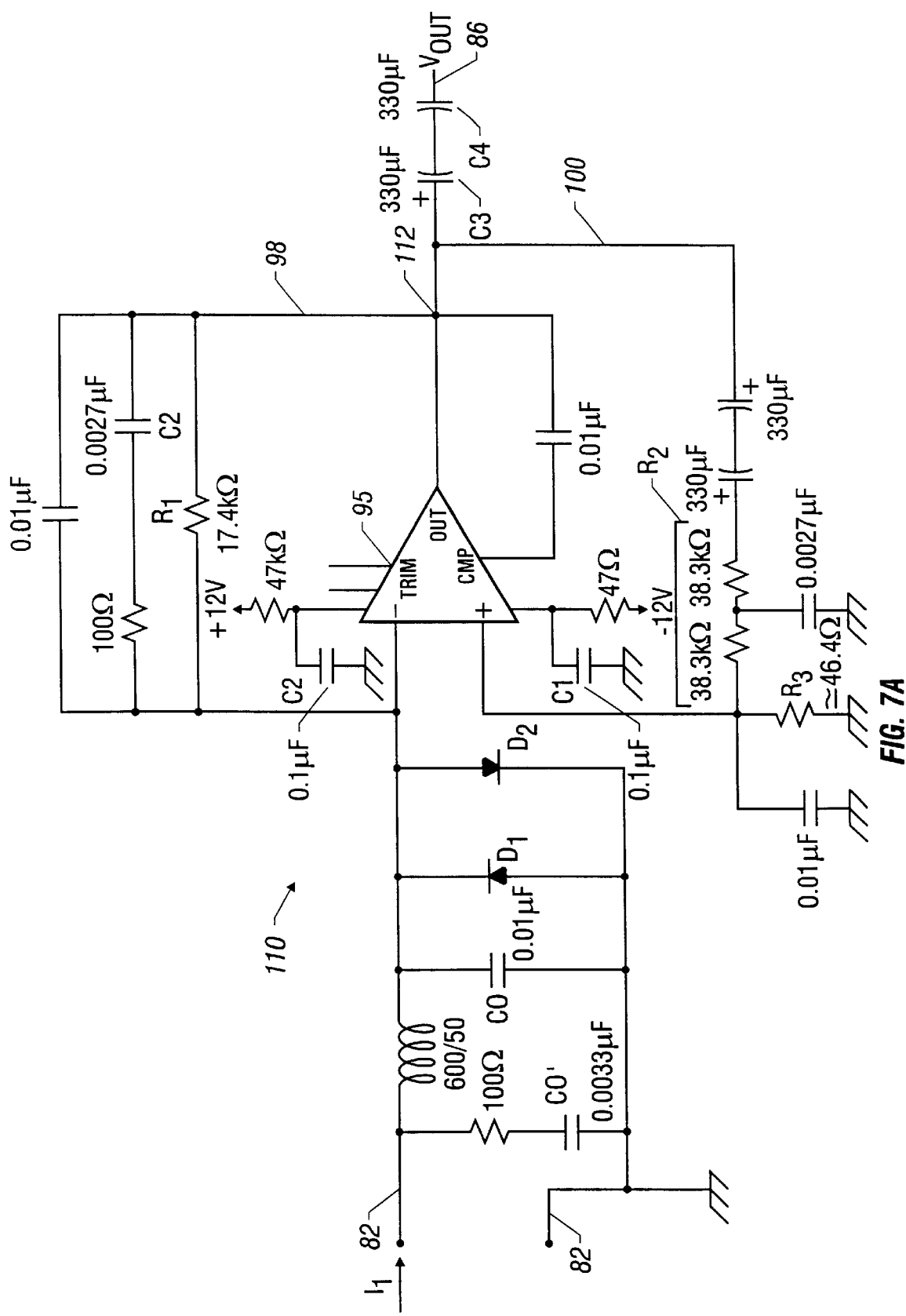
Figure 7B:
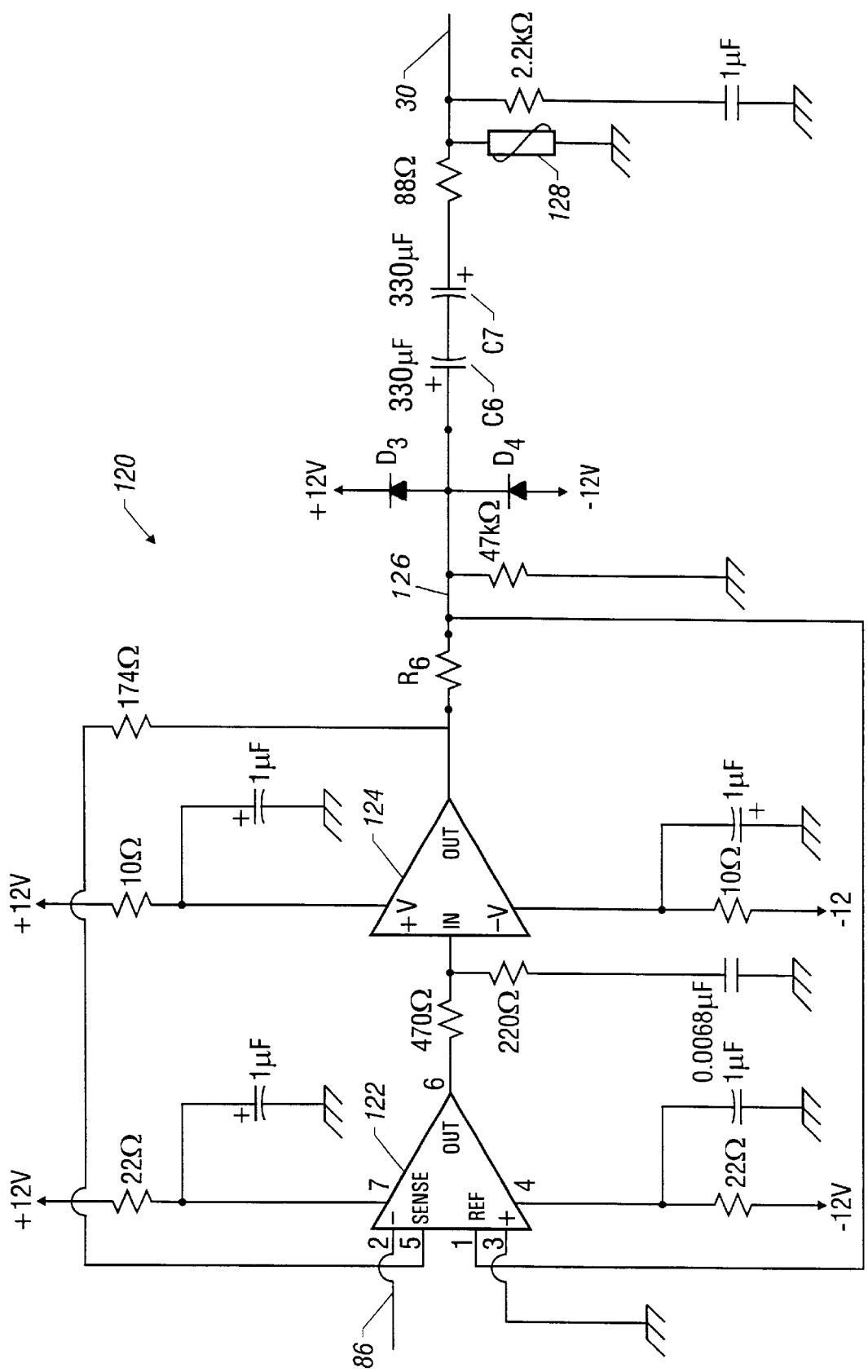
Figure 7C:
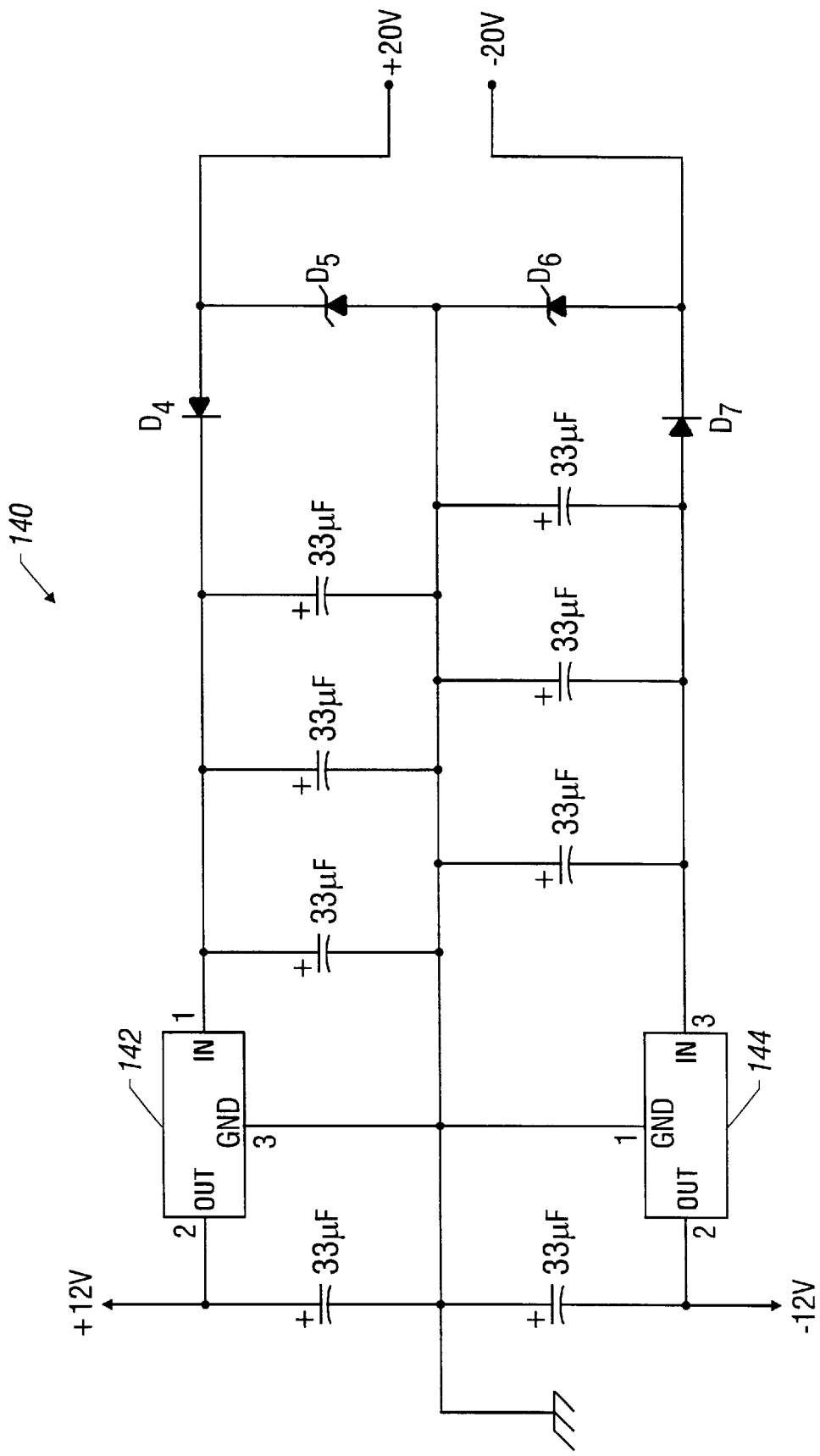
Figure 8:
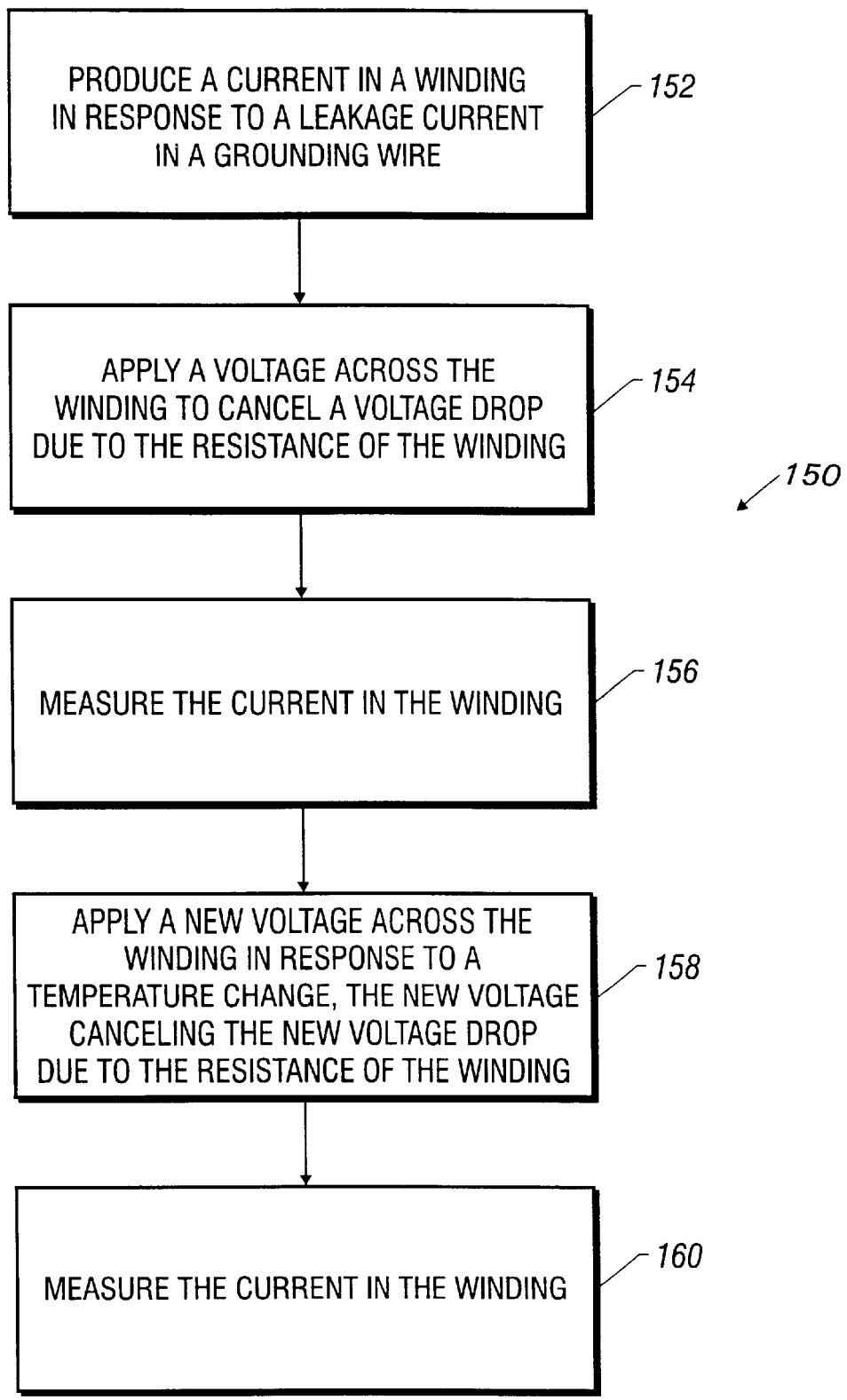

FIG. 6B schematically illustrates the first stage of the amplifier of FIG. 5;

FIG. 6C illustrates the first stage of the amplifier of FIGS. 5 and 6B using the equivalent circuit for the transformer shown in FIG. 6A;

FIGS. 7A and 7B show one embodiment of the first and second stages of the amplifier of FIGS. 5, 6A, and 6B;

FIG. 7C shows one embodiment of a regulated voltage supply for powering the first and second stages shown in FIGS. 7A and 7B; and FIG. 8 is a flow chart for a method of monitoring insulators between high voltage conductors and ground.

Figure 1:
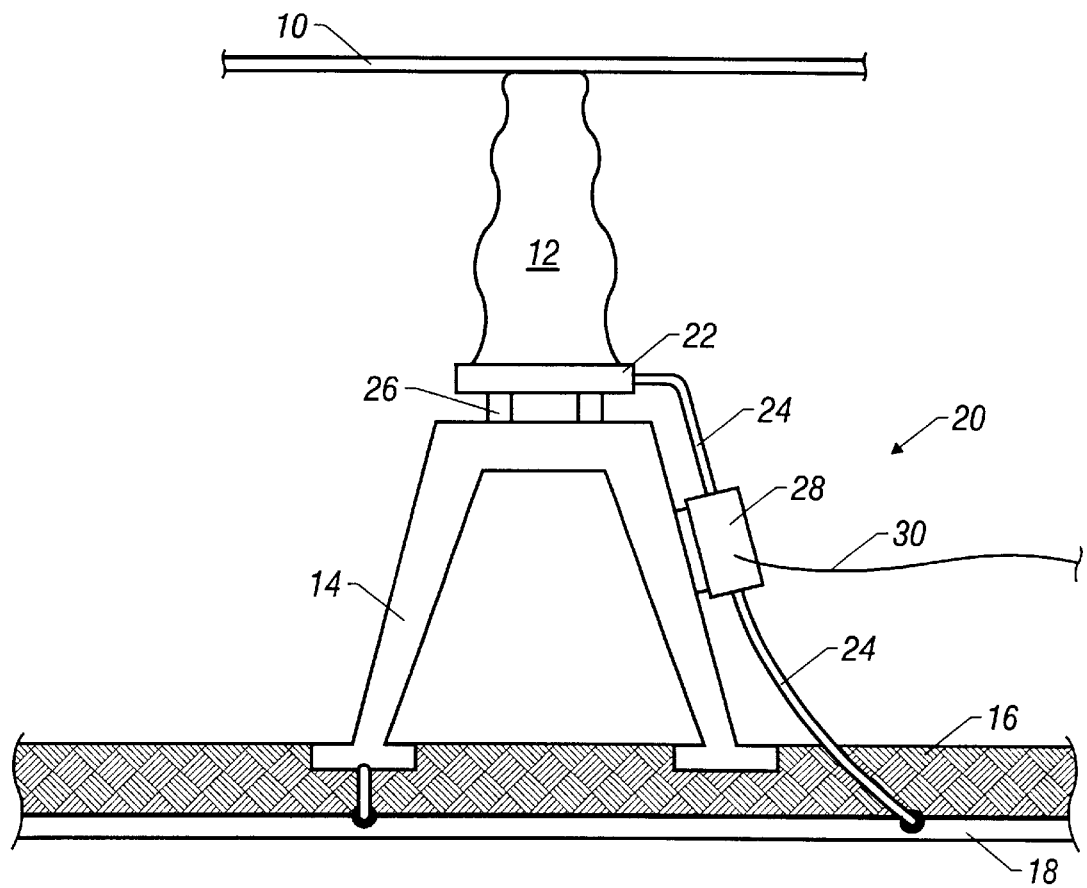
FIG. 1 shows one embodiment of a current monitoring device mounted between an insulating bushing and grounding grid of a power station.

With reference to the drawings, FIG. 1 shows a high-voltage conductor 10 as mounted in a power station. An insulating bushing 12 and metal stand 14 support conductor 10 above ground 16. The bushing could be a multiple-layered paper device, e.g., having oil between layers of paper, or a ceramic device. Leakage currents can flow between the insulating bushing 12 and ground 16. The power station has a subsurface grounding grid 18 to safely dissipate these leakage currents.

FIG. 1 also shows a device 20 for monitoring the leakage current between bushing 12 and grounding grid 18. A metal base plate 22 supports bushing 12 and provides a good electrical connection to a grounding wire 24. Grounding wire 24 connects directly to grounding grid 18 to safely dissipate leakage currents of up to about 60,000 amps flowing from bushing 12 due to nearby lightning strikes. A set of insulators 26 electrically isolates base plate 22 from stand 14 so that substantially all leakage currents pass through grounding wire 24 and not stand 14. An inductive monitoring device 28 monitors the leakage current and generates an amplified output signal on line 30. The amplified output signal is proportional to the current in grounding wire 24.

Figure 2:
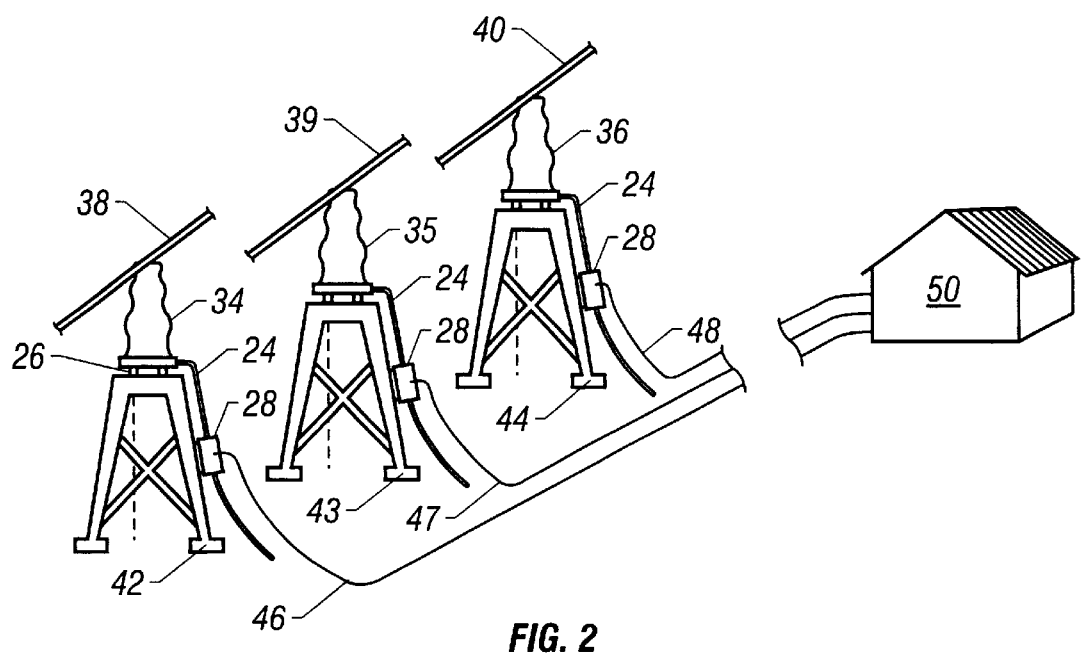
FIG. 2 shows a system, which uses monitoring devices of the type shown in FIG. 1, to measure leakage currents from several bushings in a power station.

FIG. 2 illustrates a monitoring system 32 for leakage currents to ground in a power station. A plurality of sets of insulating bushings 34–36 electrically isolate high-voltage sources 38–40. Insulators 26 electrically isolate each of bushings 34–36 so that leakage currents pass through grounding wires 24 and not supports 42–44. A separate inductive device 28, shown in FIG. 1, monitors the leakage current in grounding wire 24 for each bushing 34–36. Output lines 46–48, i.e. line 30 of FIG. 1, carry amplified signals for leakage currents from inductive monitoring devices 28 to a remote data acquisition unit 50 (DAU). DAU 50 analyzes the amplified signals and stores data on leakage currents using techniques known in the art.

Referring to FIGS. 1 and 2, monitoring device 20 can measure leakage currents from insulating bushings and current transformers (CT's) and leakage currents from other insulation structures. By measuring leakage currents, one can determine the capacitance and power dissipation of these structures. Changes in capacitance and power dissipation indicate changes to the quality of the insulating structures due to age and/or use. For example, layered foil and paper bushings, used to insulate high voltage conductors of CT's, may develop inter-layer shorts with age and/or use. The shorts affect the quality of the bushings. The monitoring device and DAU 50 can detect such shorts by monitoring for changes in capacitance and power dissipation of the bushings. By continually monitoring insulating structures, one can detect changes in their quality.

Figure 3:
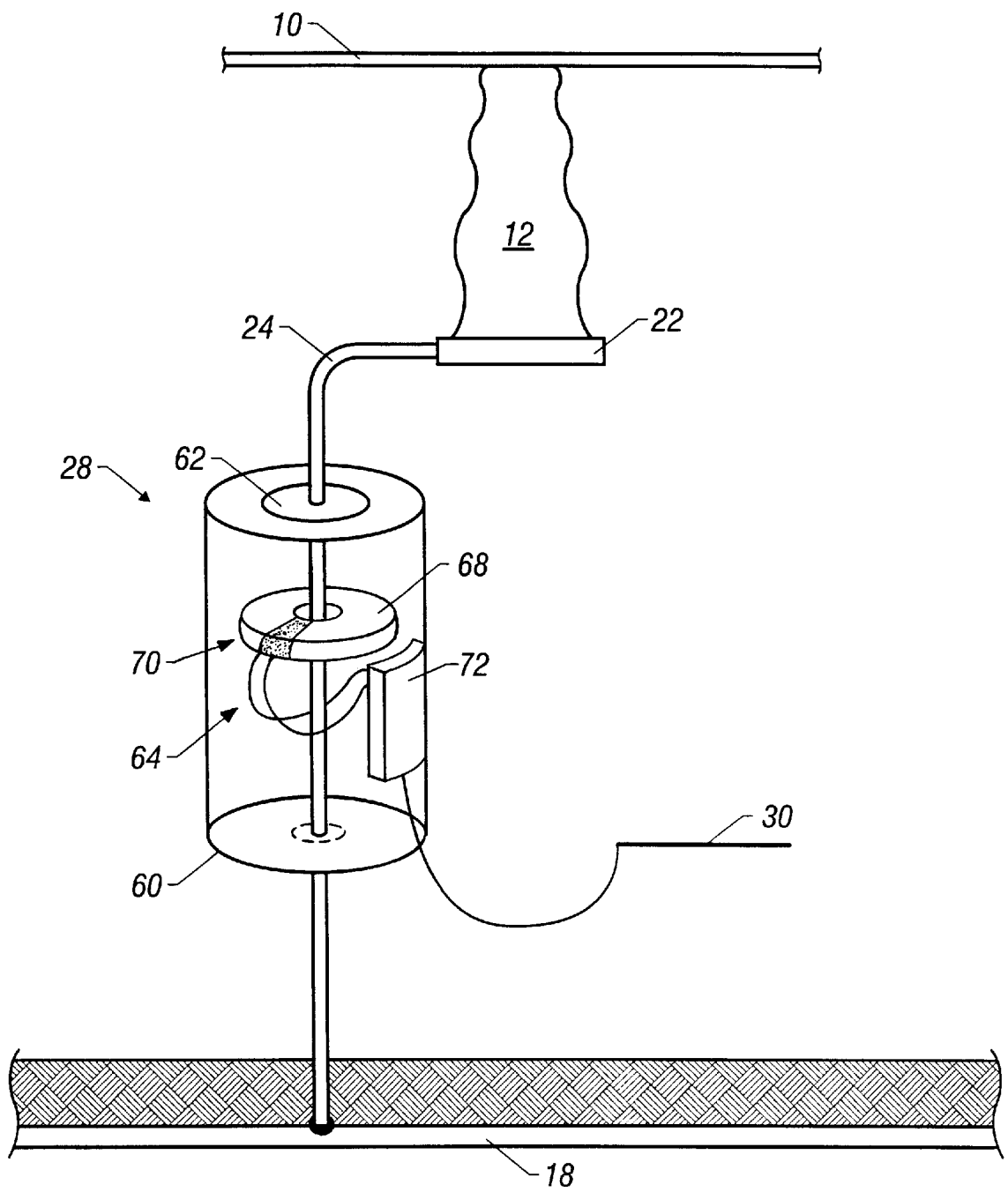
FIG. 3 illustrates an inductive component of the monitoring device and couplings with the grounding wire shown in FIG. 1.
Figure 4:
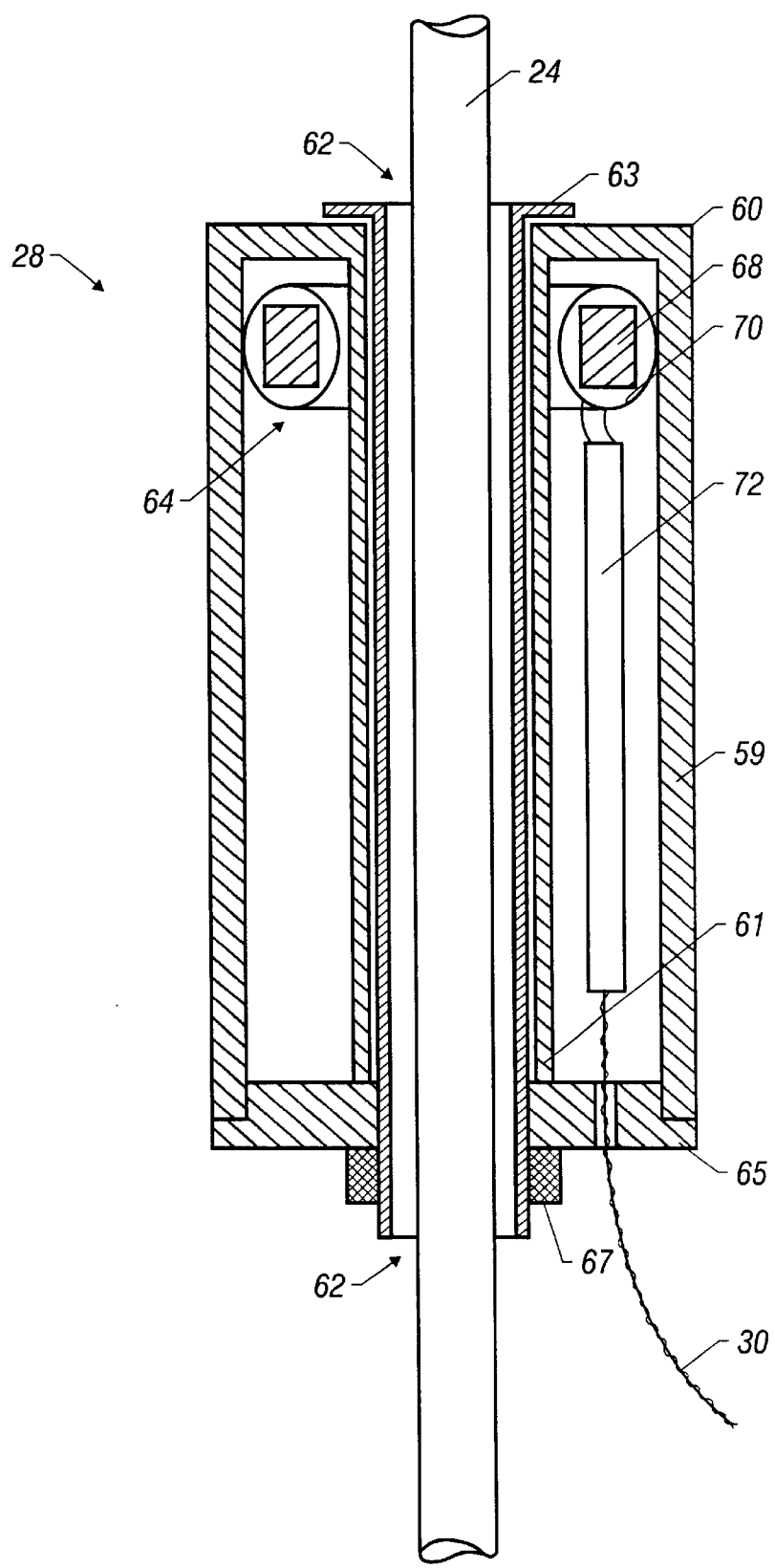
FIG. 4 illustrates current transformer of the inductive component shown in FIG. 3 in more detail.

FIGS. 3 and 4 are cross-sectional views of inductive device 28 shown in FIG. 1. A cylindrical metal housing 60 encloses inductive device 28 and provides means for shielding circuits therein from EM and radio frequency noise in the power station. Circuits are located between inner and outer metal walls 59, 61 of housing 60 in a space packed with an insulating putty. Inner metal wall 61 surrounds a central hole 62, which routes grounding wire 24 through housing 60. A plastic tube 63 insulates grounding wire 24 from inner wall 61. An insulating plastic cover 65 seals an annular open space between inner and outer walls 61, 59. A nut 67 fixes cover 65 to housing 60.

The grounding wire 24 forms a primary circuit for a measuring transformer 64 located inside metal housing 60. Measuring transformer 64 has a secondary winding 70, which connects to input terminals of an amplifier 72. Amplifier 72 produces an output signal on line 30. Output line 30 connects to DAU 50 of FIG. 2. Since measuring transformer 64 couples inductively to grounding wire 24, it introduces a low and stable impedance therein.

FIG. 4 also shows measuring transformer 64 in cross-sectional view. Grounding line 24 passes through the center of a torus-shaped core 68 to form an effective one-loop primary. Core 68 magnetically couples secondary winding 70 to grounding wire 24. Secondary winding 70 makes 1006 turns about core 68 in one embodiment. At low and moderate frequencies, core 68 has a high magnetic permeability. At high frequencies, the permeability of core 68 approaches that of air. Core 68 and secondary winding 70 induce only a very small impedance in grounding wire 24.

Measuring transformer 64 may have, at least, two types of core 68. The first type is constructed of a non-magnetic torus wrapped with a ferromagnetic permeable metal foil. One such core is model number T6006L-L2063-W517-51 manufactured by VACUUMSCHMELZE of Germany. This core has a high permeability at low and moderate frequencies and quickly saturates in high fields. A second type is a torus-shaped core comprising an insulating matrix with suspended ferrite particles. The ferrite particles provide a moderate magnetic permeability, and the core is less expensive than the wrapped core. The insulating matrix decreases magnetic screening increasing the permeability. Though the ferrite core is less expensive, it loses its magnetic permeability at lower temperatures than the wrapped core and saturates more slowly in high fields.

Referring to FIGS. 1, 3, and 4, core 68 has a small cross section and saturates rapidly if leakage currents exceed several amperes, e.g., above two amperes. After saturating, core 68 does not induce substantial currents in secondary winding 70. If a nearby lightning strike causes a high leakage current, the rapid saturation of core 68 reduces inductive energy transfer to amplifier 72 protecting delicate circuits therein from overheating. The small cross section of core 68 also aids in protecting amplifier 72 from large primary currents.

Since core 68 saturates at low current values, large currents travel through grounding wire 24 substantially unimpeded. Core 68 generates an open-secondary inductance of about 60 micro henries in grounding wire 24, but core saturation ensures that this inductance does not impede currents larger than about 2 amperes from dissipating to grounding grid 18. Monitoring device 20 does not interfere with safety protection provided by grounding wire 24, e.g., for currents produced by nearby lightning strikes.

FIG. 5 is a high-level block diagram of amplifier 72 shown in FIG. 3. Amplifier 72 has first and second stages 84, 88. Input terminals 82 of first stage 84 close a circuit through secondary winding 70. First stage 84 temperature stabilizes this circuit and generates an output voltage on line 86 substantially proportional to the leakage current in grounding wire 24. Output line 86 transmits the output voltage from first stage 84 to second-stage 88. Second stage 88 produces an output current on line 30. Output line 30 connects to data acquisition unit 50 as shown in FIG. 2. The output current on line 30 has amplitude and phase, which track the amplitude and phase of the leakage current in grounding wire 24.

The phase and amplitude of the output current on line 30 are related those of the primary current $I_P$ in a substantially frequency independent fashion at both low and moderate frequencies. Combining the embodiment 110, 120 of FIGS. 7A–7B for amplifier 72 and transformer, 64, in which secondary winding 70 has 1006 turns, produces an overall current gain of about 0.1. This gain is the product of the current gain of about 100 for amplifier 110, 120 times the current gain of about $1/1000$ for transformer 64. The overall current gain is frequency independent at low and moderate frequencies.

Referring to FIG. 5, first stage 84 isolates and/or removes radio frequency noise received from secondary winding 70. First and second stages 84, 88 both damp and/or protect against high currents, which could damage amplifier circuits. Both stages 84, 86 use a variety of means for eliminating DC offsets and high frequency noise from output lines 86, 30.

FIGS. 6A–6C schematically illustrate the operation of first stage 84 of amplifier 72.

FIG. 6A illustrates an equivalent circuit 90 for secondary winding 70 of FIGS. 3 to 5. Equivalent circuit 90 includes a current source 92, a pure inductance $L_S$ and a series resistance $R_S$. Current source 92 produces a secondary current $I_S$ proportional to the current $I_P$ in the primary, i.e. in grounding wire 24. Since the primary has one-turn, $I_S = I_P/N_S$ with $N_S$ the number of turns in secondary winding 70. Equivalent circuit 90 divides the current $I_S$ into currents $I_L$ and $I_1$, which flow through pure inductance $L_S$ and series resistance $R_S$, respectively. The amplifier 72 of FIGS. 3–5 measures the current $I_1$ leaving series resistance $R_S$. The frequency dependence of the impedance, associated with inductance $L_S$, can induce a frequency dependence in $I_1$. If $I_1$ depends on frequency, the output signal from amplifier 72 will not be proportional to the leakage current in grounding wire 24.

FIG. 6B schematically illustrates an amplifying circuit 94 for first stage 84 shown in FIG. 5. Circuit 94 produces an output voltage proportional to the primary current $I_P$ of transformer 64 of FIG. 6A. Secondary winding 70 connects between the negative input terminal of an operational amplifier 96 and a common ground. Operational amplifier 96 has first and second feedback loops 98, 100 having first and second feedback resistors $R_1$, $R_2$, respectively. Circuit 94 also has a resistor $R_3$ in a feedback loop to ground, i.e. to the second input terminal of secondary winding 70. Resistor $R_3$ is matched to internal series resistance $R_S$ of secondary winding 70 so that the output voltage $V_{OUT}$ is proportional to the primary current $I_P$ in a substantially frequency independent manner.

FIG. 6C illustrates the operation of amplifying circuit 94 of FIG. 6B using the equivalent circuit 90 of FIG. 6A. For $V_{OUT}$ to be proportional to $I_P$ and independent of frequency, the secondary current $I_S$ passes through the $R_S$-branch of equivalent circuit 90 without dividing, i.e. $I_L$ vanishes. The current $I_L$ will vanish if the active device "effectively shorts" points 102, 104 together. If the operational amplifier 96 is nearly ideal, the "−" and "+" input terminals 99 are at the same voltage. Then, points 102, 104 are "effectively" shorted together if the voltage rise over $R_3$ equals the voltage drop over $R_S$. The voltage rise equals the voltage drop if $R_3=(R_S R_2)/(R_1-R_S)$. Since $R_S \ll R1$, the condition on $R_3$ becomes $R_3=R_S(R_2/R_1)$. For this value of $R_3$, the output voltage $V_{OUT}$ is proportional to the primary current $I_P$ and independent of frequency over a wide range of frequencies, e.g., from below 10 Hertz to tens or hundreds of kilohertz. For this configuration amplifier 72 provides an accurate measurement of the primary current $I_P$, which is substantially independent of frequency.

Amplifier circuit 94 of FIGS. 6B and 6C has a negative input impedance, which functions to actively cancel the voltage drop due to internal resistance $R_S$ of secondary winding 70.

Referring to FIGS. 6A–6C, amplifier circuit 94 also compensates for changes to secondary winding resistance $R_S$ caused by variations in outdoor temperatures. Variations in outdoor temperatures change the resistance $R_S$ of the copper wire in secondary winding 70. Resistor $R_3$ has a temperature coefficient matching the temperature coefficient of copper. Thus, first stage 94 provides an output voltage $V_{OUT}$ proportional to the leakage current $I_P$ in grounding wire 24 over a selected range of outdoor temperatures.

Still referring to FIGS. 6B and 6C, one embodiment uses a model ATS135 precision wirewound resistor, manufactured by RCD Components, Inc., 520 East Industrial Park Dr., Manchester, N.H. 03109-1824, for resistor $R_3$. The temperature coefficient of the ATS135 wirewound resistor matches the temperature coefficient of copper wire between about −45° C. and 85° C. In this temperature range, $V_{OUT}$ is proportional to the leakage current in grounding wire 24 of FIGS. 1–5 and independent of frequency if $R_3$ satisfies the above-described condition at one temperature in the range.

FIGS. 7A and 7B illustrate a specific embodiment of first stage 84, 94 and second stage 88 of amplifier 72 shown in FIGS. 5, 6A, and 6B.

FIG. 7A shows a specific embodiment 110 of amplifying circuit 94 shown in FIGS. 6B and 6C. Circuit 110 operates as a current-to-voltage amplifier. An operational amplifier 96 provides for the current-to-voltage conversion in a substantially linear manner. The illustrated amplifier is a model LT1028ACN8 ultra-low noise operational amplifier manufactured by Linear Technology, 1630 McCarthy Blvd., Milpitas, Calif. 95035. A network of linear devices C0, C0' provides means for shielding circuit 110 from high frequency noise entering input terminals 82, and anti-parallel diodes $D_1$, $D_2$ protect amplifier 96 from large input currents.

A first feedback loop 98 regulates the current-to-voltage gain through resistor $R_1$. For $R_1$=17.4 KΩ, a one microamp current at input terminals 82 produces about a 17.4 millivolts (mV) signal at node 112. Second feedback loop 100 provides for temperature stabilization of the total resistance $R_S$ in secondary winding 70 as described above. Capacitors C1 and C2 limit the acceptance bandwidth so that EM noise from current discharges and radio transmitters does not overload amplifier 110. Capacitors C3, C4 remove direct current offsets from the output signal $V_{OUT}$ on line 86. Amplifying circuit 110 produces a voltage proportional to the leakage current in grounding wire 24 of FIGS. 1–5 while damping large and high-frequency input signals.

Still referring to FIG. 7A, second feedback loop 100 includes the resistor $R_3$, which has a temperature coefficient matching that of the wire of secondary winding 70 as discussed above. The value of resistor $R_3$ satisfies the above-described condition so that the total resistance of the loop closing secondary winding 70 is nearly zero and independent of temperature between about −45° C. and 85° C.

FIG. 7B shows a particular embodiment 120 of second stage 88 of FIG. 5, which is adapted for use with first stage 110 shown in FIG. 7A. Back-to-back operational amplifiers 122, 124 provide voltage-to-current conversion of the signal $V_{OUT}$ from line 86. First and second amplifiers 122, 124 are the model INA105 differential amplifier and the model BUF63 buffer amplifier, respectively, manufactured by Burr-Brown, 6730 S. Tucson Blvd., Tucson, Ariz. 85706. Diodes $D_3$, $D_4$ and surge protector 128 provide overload protection to reduce the susceptibility of second stage 120 to large transient currents in output line 30. Surge protector 128 can be an axial-lead metal-oxide varistor, model V68MA3A manufactured by Harris Semiconductor. Capacitors C6, C7 remove direct current offsets from line 126. The current produced on line 30 is proportional to the current $I_1$ between input terminals 82 multiplied by a gain of about 100.

FIG. 7C illustrates an embodiment 140 of a power source for providing +12 and −12 volt (V) regulated power supplies for first and second stages 110, 120 of FIGS. 7A and 7B. Two three-terminal regulators 142, 144 convert unregulated +20 and −20 V sources to clean regulated +12 and −12 V sources, which are less susceptible to voltage supply fluctuations. Capacitor arrays damp high-frequency, spectral components from the input and output of the power source. Diodes $D_5$–$D_8$ protect the power source against accidental connection polarity inversions.

FIG. 8 is a flow chart 150 illustrating a method of monitoring high voltage insulators, e.g., using the device 20 illustrated by FIGS. 1–7C. At block 152, transformer 64 produces a current inductively in secondary winding 70 in response to a leakage current flowing in grounding wire 24 between the insulator and grounding grid 18. At block 154, amplifier 72 applies a voltage rise across secondary winding 70 to cancel the voltage drop due to the internal resistance $R_S$ of secondary winding 70. At block 156, amplifier 72 measures the current in secondary winding 70. Amplifier 72 produces an output signal whose amplitude is proportional to the leakage current by measuring the current in secondary winding 70 at block 156. At block 158, amplifier 72 automatically applies a new voltage across winding 70 in response to a temperature change. The new voltage cancels a new voltage drop across the internal resistance $R_S$ of secondary winding 70 at the new temperature. At block 160, amplifier 72 remeasures the current in secondary winding 70. Monitoring device 20 may repeat blocks 158–160 regularly to monitor the leakage current in grounding wire 24, e.g., on a daily or weekly basis over a period of months or years.

Referring again to FIG. 2, the apparatus and methods disclosed herein may monitor leakage currents from insulators 34–36 for high voltage conductors 38–40, respectively. For example, the leakage currents may be monitored hourly, daily, or weekly over a period of one month, several months, a ½ year, one year or several years. The embodiments of FIGS. 1, 3–8 give precise measurements, because the phases of the output signal on line 30 and the leakage current are substantially equal and the amplitudes of the output signal on line 30 and the leakage current are substantially proportional in a frequency independent fashion. From such measurements, the DAU 50 of FIG. 2 may automatically determine the capacitances and power dissipations of each of the monitored insulators 34–36 at regular intervals. The system 32 can track changes in the quality of the insulators 34–36 with age or use by comparing these measurements for different measuring times.

Specific embodiments have been shown by way of example in the drawings and detailed description. Nevertheless, the invention is susceptible to modifications and alternate forms, which a person of ordinary skill in the art would be able to make without undue experimentation in light of the present disclosure. The invention is to include such modifications and alternate forms and to cover all modifications, equivalents, and alternates falling within the spirit and scope of the appended claims.

What is claimed is:

1. Apparatus for monitoring leakage currents from an insulator for a high voltage conductor to ground comprising:

a transformer comprising a primary wire and a secondary winding, the secondary winding having a secondary resistance, the primary wire constructed and arranged to carry a leakage current from the insulator to the ground; and an amplifier having an input connected to the secondary winding, constructed and arranged to produce an output signal proportional to the leakage current;

and wherein the transformer further comprises a ferromagnetic core.

2. The apparatus of claim 1, wherein the amplifier is constructed and arranged to produce a negative input impedance across the secondary winding to substantially cancel the voltage drop in the winding due to the secondary winding resistance.

3. The apparatus of claim 1, further comprising:

a high voltage insulator; and a grounding grid, the primary wire connecting the high voltage insulator to the grounding grid.

4. The apparatus of claim 3, further comprising a data acquisition unit constructed and arranged to receive the output signal and to determine from the output signal at least one of the capacitance and the power dissipation by the high voltage insulator.

5. The apparatus of claim 1, wherein the core comprises ferrite particles dispersed in an insulating matrix.

6. Apparatus for monitoring leakage currents from an insulator for a high voltage conductor to ground comprising:

a transformer comprising a primary wire and a secondary winding, the secondary winding having a secondary resistance, the primary wire constructed and arranged to carry a leakage current from the insulator to the ground;

an amplifier having an input connected to the secondary winding, constructed and arranged to produce an output signal proportional to the leakage current; and wherein the amplifier has a temperature-dependent input impedance adapted to produce a voltage rise substantially canceling the voltage drop due to the resistance for a range of temperatures.

7. Apparatus for monitoring leakage currents between a high voltage insulator and ground, comprising:

a transformer having a primary wire and a secondary winding, the secondary winding having a secondary resistance, the primary wire adapted to carry a leakage current from the high voltage insulator to the ground; and an amplifier having input terminals connected across the secondary winding, the amplifier constructed and arranged to produce a voltage rise across the secondary winding substantially canceling a voltage drop across the resistance of the secondary winding and to output signal characteristic of the leakage current in the primary wire.

8. The apparatus of claim 7, wherein the transformer further comprises a ferromagnetic core.

9. The apparatus of claim 7, wherein the core has a high permeability and saturates in response to a leakage current in the primary wire of several amperes.

10. The apparatus of claim 7, wherein the amplifier is constructed and arranged to produce a voltage rise across the secondary winding to substantially cancel a voltage drop across the resistance of the secondary winding over a range of temperatures.

11. The apparatus of claim 7, further comprising:

a high voltage insulator; and a grounding grid, the primary wire connecting the high-voltage insulator to the grounding grid.

12. The apparatus of claim 7, wherein the primary wire is constructed and arranged to carry a current produced by a lightning strike from the insulator to ground.

13. The apparatus of claim 7, further comprising a shield around the amplifier.

14. A method of monitoring a leakage current from an insulator for a high voltage conductor, comprising:

directing the leakage current into a grounding wire;

inducing a secondary current in a secondary winding having a resistance inductively coupled to the grounding wire;

applying a voltage across the secondary winding to substantially cancel a voltage drop in the winding across the resistance; and processing the secondary current to provide an output signal characteristic of the leakage current.

15. The method of claim 14, wherein the processing includes providing an amplified signal from the secondary current, the amplitude of the amplified signal being proportional to the amplitude of the leakage current.

16. The method of claim 14, further comprising repeating the directing, inducing, applying and processing to provide a sequence of output signals characteristics of aging properties of the insulator.

17. The method of claim 16, further comprising:

comparing at least two of the output signals to determine whether the quality of the insulator has changed.

* * * * *